(12) United States Patent
Kretschmann

(10) Patent No.: US 11,347,195 B2
(45) Date of Patent: *May 31, 2022

(54) MODULAR BACKPLANE FOR AN INDUSTRIAL CONTROLLER

(71) Applicant: Rockwell Automation Technologies, Inc., Mayfield Heights, OH (US)

(72) Inventor: Robert J. Kretschmann, Mayfield Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 13 days.

This patent is subject to a terminal disclaimer.

(21) Appl. No.: 16/919,397

(22) Filed: Jul. 2, 2020

(65) Prior Publication Data

US 2020/0333758 A1    Oct. 22, 2020

Related U.S. Application Data

(63) Continuation of application No. 16/366,604, filed on Mar. 27, 2019, now Pat. No. 10,739,745.

(51) Int. Cl.
*G05B 19/05* (2006.01)
*H04L 12/54* (2022.01)

(52) U.S. Cl.
CPC ............ *G05B 19/054* (2013.01); *H04L 12/56* (2013.01); *G05B 2219/14014* (2013.01); *G05B 2219/15077* (2013.01); *G05B 2219/15119* (2013.01)

(58) Field of Classification Search
CPC ........ G05B 19/054; G05B 2219/14014; G05B 2219/15077; G05B 2219/15119; H04L 12/56
See application file for complete search history.

(56) References Cited

U.S. PATENT DOCUMENTS

| 5,225,974 A | 7/1993 | Mathews et al. |
| 7,133,416 B1 | 11/2006 | Chamdani et al. |

(Continued)

FOREIGN PATENT DOCUMENTS

| EP | 2421344 A2 | 2/2012 |
| EP | 2693568 A1 | 2/2014 |

OTHER PUBLICATIONS

Partial European Search Report dated Jun. 17, 2020; Application No. 20166005.7—(21) pages.

(Continued)

*Primary Examiner* — Omeed Alizada
(74) *Attorney, Agent, or Firm* — Boyle Fredrickson, SC

(57) ABSTRACT

An industrial controller with a modular backplane includes multiple modules, where each module includes a base and a chassis. Electrical connectors located on each side of the base engage the base of an adjacent module such that the bases are electrically connected. The backplane is defined by and extends through each of the bases connected to each other. A chassis is inserted into each base. Each chassis includes an embedded switch and a local circuit. The embedded switch is in communication with the base, and the local circuit performs the operation of the corresponding module. The embedded switch receives data transmitted along the backplane between bases. The embedded switch reads the data intended for the module and passes the data to the local circuit for further processing. Similarly, the embedded switch receives data from the local circuit and inserts the data on the backplane for transmission to the appropriate module.

18 Claims, 12 Drawing Sheets

(56) References Cited

U.S. PATENT DOCUMENTS

| | | |
|---|---|---|
| 2004/0095881 A1 | 5/2004 | Borella et al. |
| 2007/0266192 A1 | 11/2007 | Campini et al. |
| 2012/0057307 A1 | 3/2012 | Kang et al. |
| 2013/0010588 A1 | 1/2013 | Kretschmann et al. |
| 2016/0073542 A1 | 3/2016 | Huang et al. |

OTHER PUBLICATIONS

Nelly Ayllon; Scalable PROFINET System Redundancy—PI North America Blog; https://us.profinet.com/scalable-profinet-system-redundancy/; dated Aug. 30, 2018—(4) pages.
Extended European Search dated Aug. 27, 2020; Application No./Patent No. 20166005.7-1202—(25)—pages.

MODULAR BACKPLANE FOR AN INDUSTRIAL CONTROLLER

This application is a continuation of and claims priority to U.S. application Ser. No. 16/366,604, filed Mar. 27, 2019, the entire contents of which is incorporated herein by reference.

BACKGROUND INFORMATION

The subject matter disclosed herein relates to industrial control systems and, in particular, to a method and system for providing a modular backplane in an industrial controller for scalability and configurability.

Industrial controllers, such as programmable logic controllers (PLC's) or programmable activity controllers (PAC's), are specialized electronic computer systems used for the control of industrial machines or processes, for example, in a factory environment. Industrial controllers differ from conventional computers in a number of ways. Physically, they are constructed to be substantially more robust against shock and damage and to better resist external contaminants. The industrial controllers perform real-time control and execute languages allowing ready customization of programs to comport with a variety of different controller applications. Industrial controllers may have a user interface for accessing, controlling and/or monitoring the industrial controller, such as through a locally connected terminal having a keyboard, mouse and display.

As is known to those skilled in the art, industrial controllers are configurable according to the requirements of the controlled machine or process. The industrial controller includes a processor module and various input and output modules. The input modules receive signals from sensors, switches, and other devices providing the operating status of the controlled machine or process. The processor module executes a control program which receives the input signals and generates output signals in response to the operating status of the controlled machine or process. The output signals are delivered from the output modules to actuators, indicators, and other devices to achieve a desired operation of the controlled machine or process. Still other modules, such as a counter module, network module, and the like may be included in the controlled machine or process.

In order to receive input signals from and provide output signals to various modules, the processor module must communicate with each module. Typically, a dedicated communication bus, also known as a backplane, is provided between the processor module and each additional module connected to the processor module. The backplane is configured to accommodate high-speed and reliable communications between modules. Additionally, because the bus is a dedicated bus configured to communicate between known modules, communication can occur in a predefined format, such as a proprietary communication protocol or utilizing a predefined communication schedule that requires little or no data overhead, such as headers, footers, checksums, and the like. However, each module must utilize the same protocol and be configured to communicate according to the predefined format on the backplane.

Typically, a backplane is configured in a linear, or daisy-chain, format. Modules are mounted in a rack or otherwise mounted adjacent to each other and data is transmitted between adjacent modules. A linear configuration, however, is not without certain drawbacks. If one module is removed from the system, the chain is broken and modules cannot communicate with modules beyond the open slot.

Thus, it would be desirable to provide an industrial controller with a linear backplane that maintains communication between modules when one module fails or is removed.

In certain applications, such as a safety application or a high-reliability application, the industrial controller may be configured to use redundant devices and/or redundant communication busses to achieve a desired a safety rating or a desired operational reliability for the application. In such an application, the industrial controller may include two processor modules, pairs of input modules, pairs of output modules, and dual communication paths between each of the modules. Adding the redundant configuration is not without certain drawbacks. When an industrial controller is configured in the redundant configuration, every module is duplicated increasing hardware expense as well as installation and commissioning expense. In addition, if a user wishes to upgrade an existing system, the existing hardware needs to be removed and replaced.

In certain applications, however, it would be desirable to provide an industrial controller which can provide a range of capability, including simple, general applications, high reliability applications, or a combination thereof. Thus, it would be desirable to provide a modular industrial controller that permits flexible configuration and interconnection between different types of modules and that also simplifies upgrades of existing systems.

BRIEF DESCRIPTION

The subject matter disclosed herein describes a modular industrial controller with a backplane that maintains communication between modules when one module fails or is removed and that facilitates an upgrade between redundant and non-redundant modules. Each module includes a base and a chassis. Connectors, which may be either electrical or optical, connect each base to another base. A first connector may be located on one side of the base and a second connector may be located on the opposite side of the base, where the first connector is complementary to the second connector. The first connector of one base engages the second connector of another base, such that bases mounted adjacent to each other are electrically connected and communicatively coupled to each other. The backplane is defined, in part, by each base and extends through each of the bases connected to each other. Optionally, a cable may be run between a first connector and a second connector joining, for example, a first row of modules and a second row of modules and extending the backplane between rows of modules.

A chassis is inserted into each base. Each chassis includes an embedded switch and an additional local circuit. The embedded switch is in communication with the base and the local circuit is configured to perform the operation of the corresponding module. The embedded switch receives data transmitted along the backplane between bases and is configured to identify data intended for the module in which the switch is embedded. The embedded switch reads the data intended for the module and passes the data to the local circuit for further processing. Similarly, the local circuit may generate data for transmission to other modules along the backplane. The embedded switch receives the data from the local circuit and inserts the data on the backplane for transmission to the appropriate module.

According to one embodiment of the invention, a modular backplane for an industrial controller includes a first module and multiple additional modules. The first module includes a first base and a first chassis. The first base defines, in part, a backplane for the industrial controller, and the first chassis is removably mounted to the first base. The first chassis includes a first embedded switch in communication with the first base. Each additional module includes a second base and a second chassis. The second base defines, in part, the backplane for the industrial controller and is in communication with at least one of the first base and the second base of another additional module. The second chassis is removably mounted to the second base and includes a second embedded switch in communication with the second base. The first embedded switch is operative to receive first data from a first network at a first port and receive second data from a backplane at second and third ports. The first network is arranged in a single-path star format, and the backplane extends between the first module and each of the plurality of additional modules. The first embedded switch is also operative to transmit the first and second data via one of the first, second, and third ports.

According to another embodiment of the invention, a modular backplane for an industrial controller includes a first module and multiple additional modules. The first module includes a first base and a first chassis. The first base defines, in part, a backplane for the industrial controller. The first base includes first and second connectors and first and second ports. The first port is in communication with the first connector, and the second port is in communication with the second connector. The first chassis is mounted to the first base and includes a first embedded switch. The first embedded switch has a first port in communication with the first port of the first base to communicate on the backplane via the first connector and a second port in communication with the second port of the first base to communicate on the backplane via the second connector. The first embedded switch is configured to receive a plurality of first data packets from a network operatively connected to the first embedded switch and to receive a plurality of second data packets from the backplane. The first embedded switch is further configured to transmit the first and second data packets to either the network or the backplane. Each additional module includes a second base and a second chassis, where the second base defines, in part, the backplane for the industrial controller. The second base includes a first connector, a second connector, a first port, a second port, a first switch, and a second switch. The first connector of the second base is operative to be connected to the second connector on either the first base of the network module or the second base of another additional module. The first port is in communication with the first connector of the second base, and the second port is in communication with the second connector of the second base. The first switch is operative to selectively connect the first port between the first connector and either the second chassis mounted to the second base or the second switch of the second base. The second switch is operative to selective connected the second port between the second connector and either the second chassis or the first switch of the second base. The second chassis is mounted to the second base and includes a second embedded switch. The second chassis has a first port and a second port, the first port of the second chassis is in communication with the first port of the second base, and the second port of the second chassis is in communication with the second port of the second base. The second embedded switch is operative to receive the data from the backplane via one of the first and second ports in the second embedded switch.

According to still another embodiment of the invention, an industrial controller with a modular backplane includes a processor module, a network module, and multiple additional modules. The processor module includes a first base and a first chassis. The first base defines, in part, a backplane for the industrial controller, and includes a first electrical connector. The first chassis is removably mounted to the first base and includes a first embedded switch in communication with the first electrical connector. The network module includes a second base and a second chassis. The second base defines, in part, the backplane for the industrial controller, includes a second electrical connector on a first side of the second base, and includes a third electrical connector on a second side of the second base. The second chassis includes a second embedded switch in communication with the second and third electrical connectors. Each of the additional modules includes a third base and a third chassis. The third base defines, in part, the backplane for the industrial controller. The third base includes a fourth electrical connector on a first side of the third base and a fifth electrical connector on a second side of the third base. The third chassis includes a third embedded switch in communication with the fourth and fifth electrical connectors. The first electrical connector is removably connected to either the second electrical connector or the fourth electrical connector for one of the additional modules, the third electrical connector is removably connected to the fourth electrical connector for one of the additional modules, and the fifth electrical connector is removably connected to either the second electrical connector or the fourth electrical connector for one of the additional modules. The first, second, and third bases define the backplane for the industrial controller, and the first, second, and third embedded switches receive data from the backplane for the corresponding chassis in which the switch is embedded. Either the first or second embedded switch receives data from a network connected to either the processor module or the network module, respectively.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
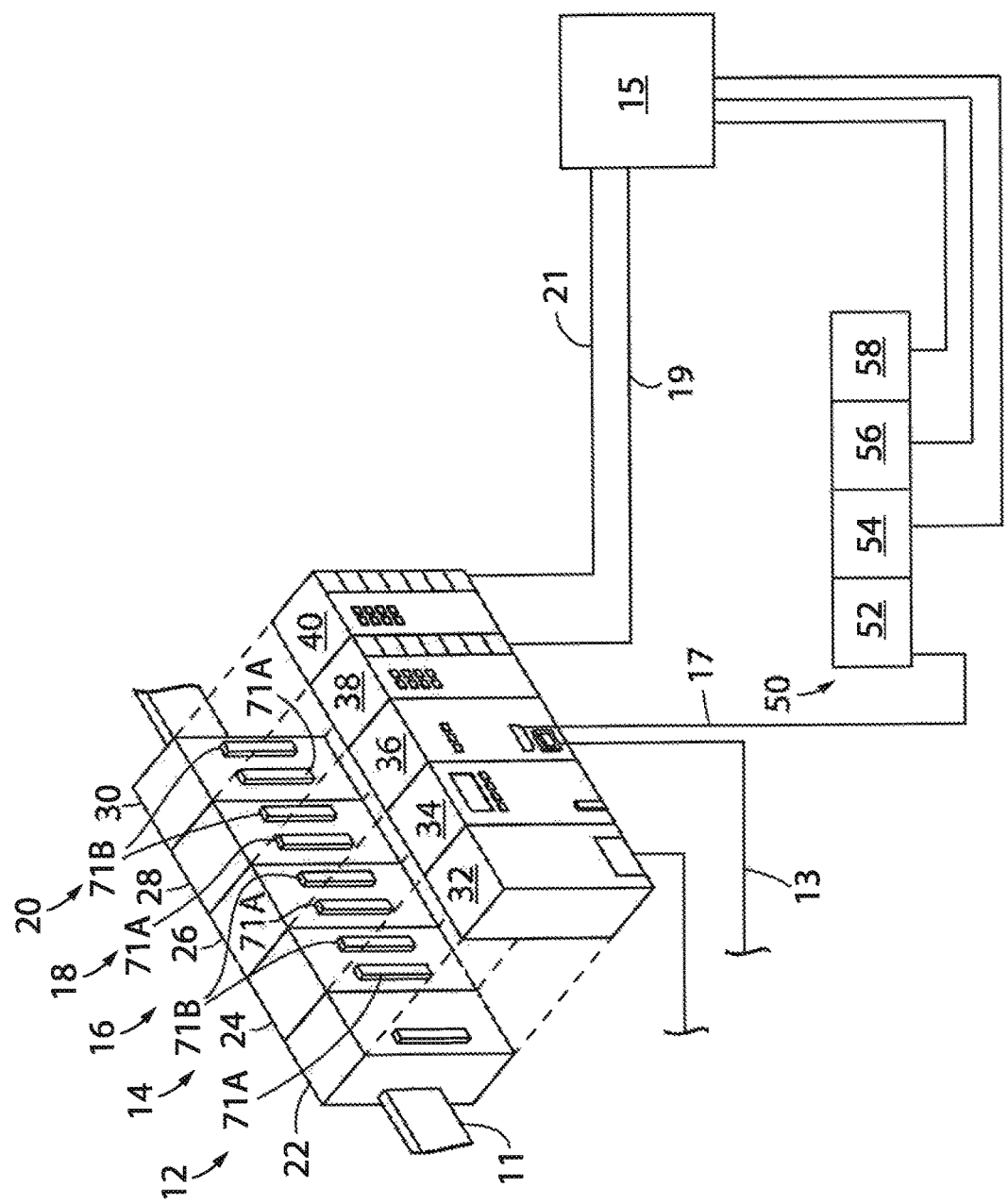
FIG. 1 is a schematic representation of an industrial control system in accordance with one embodiment of the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Turning initially to FIG. 1, an exemplary industrial control system incorporating one embodiment of a modular backplane in an industrial controller 10 is illustrated. The industrial controller 10 is configured to control operation of a machine or process 15. The industrial controller may be made up of numerous different modules connected together in a rack or mounted to a rail. Additional modules may be added or existing modules removed and the industrial controller 10 reconfigured to accommodate the new configuration. Optionally, the industrial controller 10 may have a predetermined and fixed configuration. According to the illustrated embodiment, each module 12, 14, 16, 18, 20 includes a base 22, 24, 26, 28, 30 mounted to a DIN rail 11 and a chassis 32, 34, 36, 38, 40 which is plugged in to the respective base. The illustrated industrial controller 10 includes a power supply module 12, a processor module 14, a network module 16, an input module 18, and an output module 20. The input and output modules 18, 20 may be selected according to the application requirements and may be, for example, analog or digital input or output modules, which will be referred to herein generally as an I/O module. Input signals 19 provide information to the industrial controller 10 regarding operation of the controlled machine or process 15 and are provided to the input module 18. The input modules 18 communicate the input signals 19 to the processor module 14 via a backplane as will be discussed in more detail below. The processor module 14 executes a control program to generate output signals 21 responsive to the input signals 19. The output signals are transmitted from the processor module 14 to the output module 20 via the backplane. The output signals 21 are, in turn, transmitted from the output module 20 to controlled devices to achieve desired operation of the controlled machine or process 15. Additionally, while only a single input and a single output module are illustrated, it is contemplated that various numbers of input and/or output modules may be used according to the requirements of the controlled machine or process 15 and may be connected locally by mounting additional bases to the DIN rail and plugging the bases together.

Optionally, a remote I/O rack 50 may provide additional input and output modules 54, 56, 58 and is connected to the network module 16 via a network cable 17 and an I/O adapter module 52. Each remote rack 50 may be positioned at varying positions about the controlled machine or process 15. Each remote rack 50 may be modular and made up of numerous different modules connected together in a rack or mounted to a rail. Additional modules may be added or existing modules removed and the remote rack 50 reconfigured to accommodate the new configuration. Optionally, the remote rack 50 may have a predetermined and fixed configuration. As illustrated, the remote rack 50 includes an adapter module 52, configured to communicate on an industrial network 17 such as Ethernet/IP, DeviceNet, or ControlNet to the network module 16, and additional input and output modules 54, 56, 58. Each input module is configured to receive input signals from the controlled machine or process 15, and each output module is configured to provide output signals to the controlled machine or process 15. Optionally, still other modules may be included in the remote rack 50. According to one embodiment, the remote rack 50 may include an additional processor module 14, where each processor module 14 is configured to control a portion of the controlled machine or process.

Figure 4:
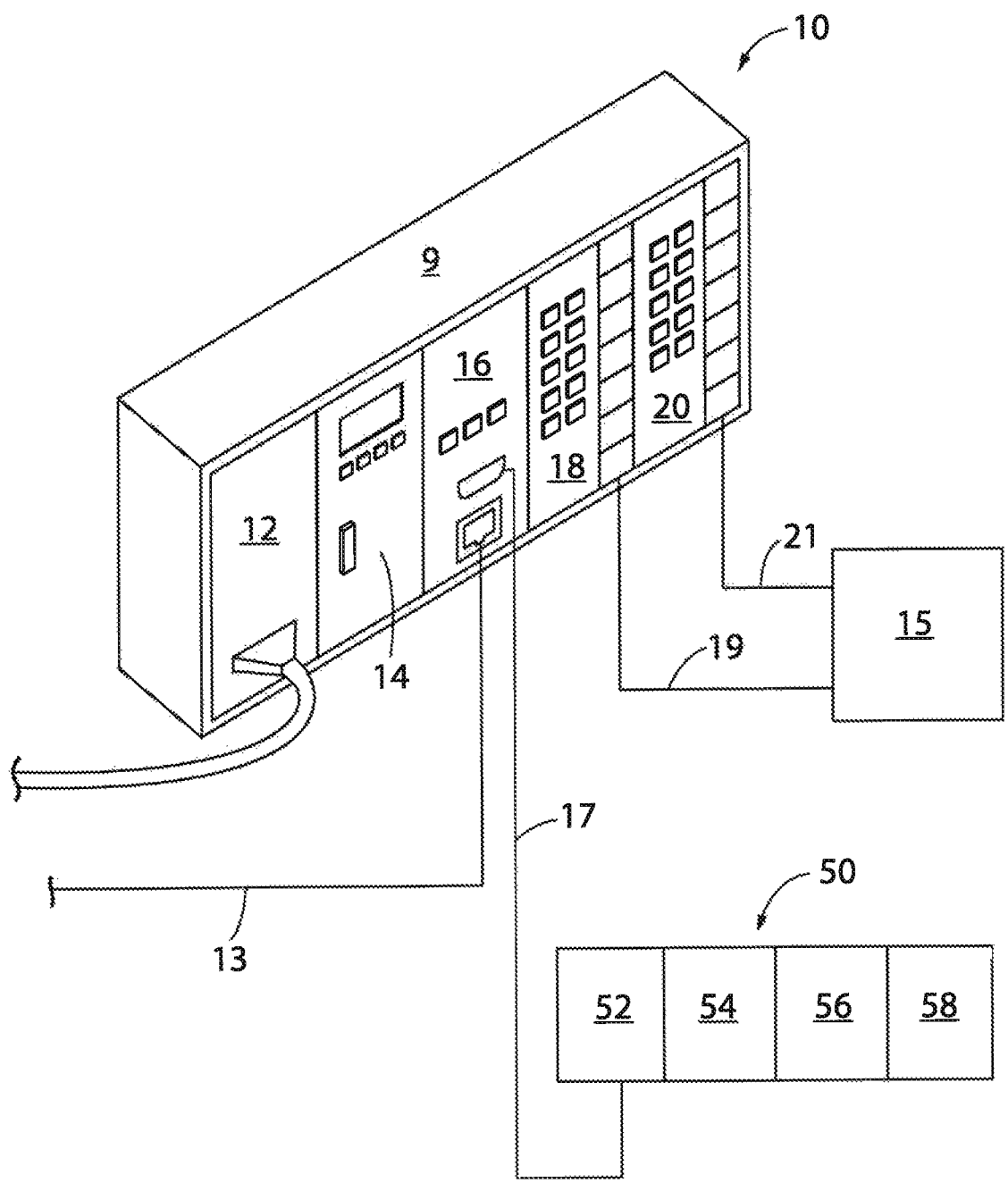
FIG. 4 is a schematic representation of an industrial control system in accordance with another embodiment of the present invention.

It is understood that the industrial control network, industrial controller 10, and remote racks 50 may take numerous other forms and configurations without deviating from the scope of the invention. With reference, for example, to FIG. 4, the industrial controller 10 may include a rack 9 in which each module is inserted. The rack 9 may serve as a base for each module. The power supply 12 may be removably mounted or may be a fixed component and integrally mounted to the rack 9. The processor module 14, network module 16, input module 18, and output module 20 are removably inserted into the rack 9. The rack 9 may be configured as a base with 4 slots and each module configured as a chassis which is inserted into one slot of the base as will be discussed in more detail below. Optionally, the rack 9 may include other numbers of slots without deviating from the scope of the invention.

Figure 2:
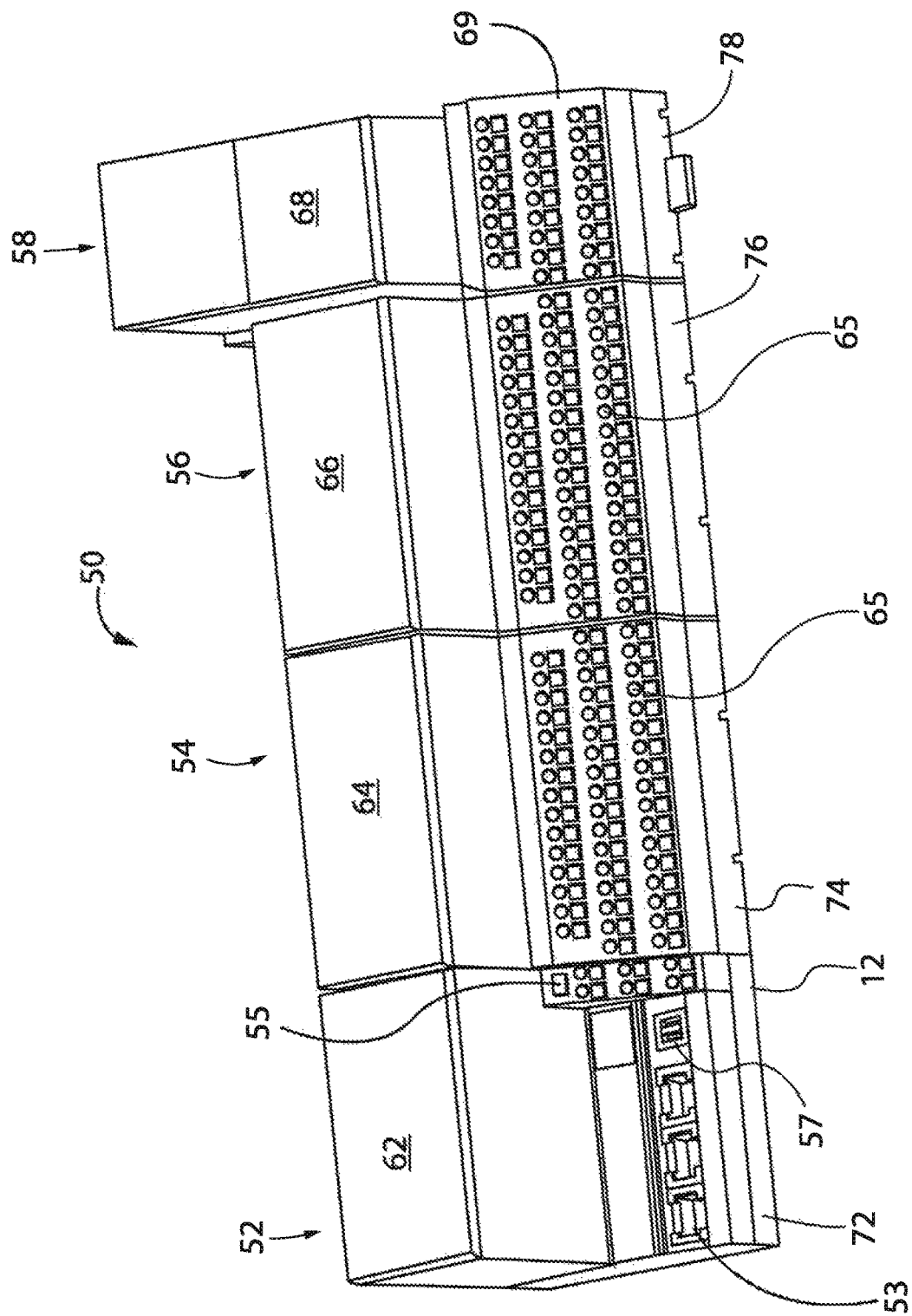
FIG. 2 is an isometric view of a bank of remote modules for the industrial control system of FIG. 1.

Turning next to FIG. 2, the remote bank of modules 50 in accordance with one embodiment of the present invention is illustrated. The bank of modules 50 includes a series of enclosures arranged from left to right, side-by-side, with complex shapes that may be generally described as cubic. The series of enclosures include a left most adapter module 52, followed by a first I/O module 54, a second I/O module 56, and a third I/O module 58. Each module is held in close proximity to the other, thereby facilitating connections, either electrical or optical, side by side to establish communications. Each module may be held by attachment to a DIN rail 51, see also FIG. 3. In an alternative embodiment, one or more modules may be held with greater separation and having electrical connections supported by network cabling.

The adapter module 52 may further comprise a plurality of various connectors 53, as well as visual displays 55 and/or LED's for system monitoring, located on one or more respective surfaces. Possible connectors may include, for example, a plurality of RJ-45 network connectors for network connectivity of the bank, for example, to a remote computer or to a Programmable Logic Controller (PLC); a Universal Serial Bus (USB) and/or IEEE 1394 connector for a locally connected terminal or device; a network connector corresponding to a particular industrial network; or any other advantageous connector as known in the art. The adapter module 52 also includes a power connector 57 for powering the bank.

It is contemplated that each module may include a base 72, 74, 76, 78 and a chassis 62, 64, 66, 68 mounted to the base. Different I/O modules 54, 56 may utilize a common base where each base 74, 76 includes common components between modules 54, 56, such as interconnections between adjacent modules, terminals 65, and connectors 71 (see also FIG. 3) to the chassis 64, 66. Each chassis 64, 66 may include components that differ between modules, such as logic circuits to receive inputs, drive outputs, or process analog or digital signals. Each chassis 64, 66 may be plugged into the base 74, 76 and the chassis and base provided together as a complete I/O module 54, 56. The other modules, such as the adapter module 52 and the third I/O module 58 may similarly include a base 72, 78 and chassis 62, 68 configuration where the base 72, 78 for the adapter module 52 and the third I/O module 58 are different from each other and also different than the base 74, 76 for the first and second I/O module 54, 56. According to another embodiment of the invention, each module may have a single housing or, optionally, a combination of modules including a single housing or a base and chassis construction may be utilized. According to still another embodiment of the invention a single base may be configured to receive two, four, or still other numbers of chassis. The base for each module includes electrical connectivity and base logic to facilitate a backplane between the modules.

I/O modules 54, 56 and 58 may further comprise a plurality of electrical terminals (or terminal blocks) 65 and 69 respectively, for receiving conductors exposed on the surface of each enclosure to releasably retain electrical conductors communicating between the I/O module and a device on the controlled processes or machines (not shown). Each chassis of the I/O module may resemble the other in size, color and shape, though these aspects may differ by function. The number of terminals 65, 69 present in each terminal block may differ according to the base and to the function of the I/O module. The I/O modules 54, 56, and 58 may be configured, for example, to receive either an analog or digital input or output. The input or output voltages may be, for example, a DC voltage between 5-48 VDC or an AC voltage of 120 VAC.

Figure 3:
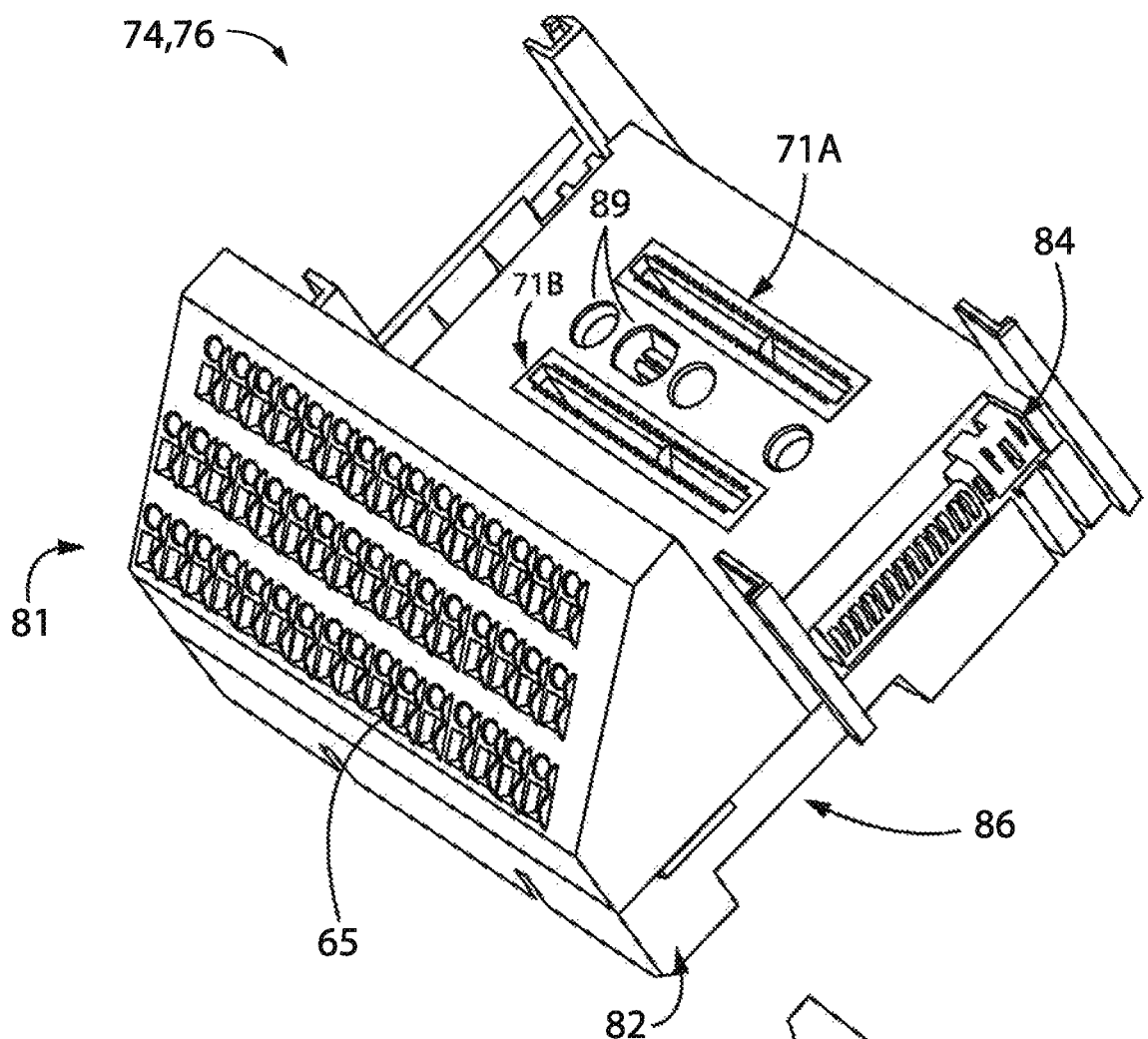
FIG. 3 is an isometric view of a single base for an I/O module of FIG. 1.
Figure 3:
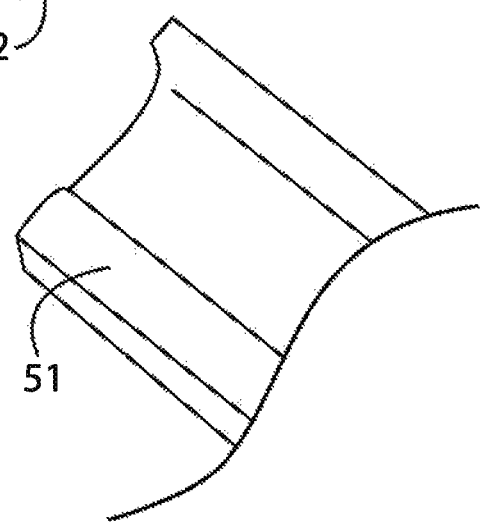

Referring now to FIG. 3, an exemplary base 74,76 for an I/O module in accordance with an embodiment of the present invention is illustrated. The I/O module base 74, 76 is a common base used between the first I/O module 54 and the second I/O module 56 in the illustrated embodiment. The base has a housing with a left side 81 and a right side 82. Each side may further comprise a releasable connector 84 with complementary connectors supported on each side and exposed to connect to adjacent modules on the left and right sides, such that adjacent connectors can engage each other and establish communication between adjacent bases. It is contemplated that the connector 84 may be an electrical connector, optical connector, or any suitable connector to establish communication between adjacent bases. For discussion herein, the illustrated embodiment includes an electrical connector 84 and an electrical connection is established between adjacent bases. The I/O module base 74, 76 may further comprise a releasable mechanical connector 86 for holding the I/O module in position relative to the adjacent modules by attachment, for example, to a DIN rail 51. As described above, each I/O module base 74, 76 may further comprise a plurality of electrical terminals (or terminal blocks) 65 for receiving conductors exposed on the surface of the enclosure to releasably retain electrical conductors communicating between devices on the controlled processes or machines and I/O function card held within the chassis of the I/O module. One or more slots 71A, 71B may be provided on the base to establish electrical connections between the base 74, 76 and the chassis 64, 66 mounted on the base. One or more mating receptacles 89 may also be provided to establish a mechanical connection with and positively retain the chassis to the base. Although discussed above with respect to the remote bank of modules 50, the modular structure of bases 72, 74, 76, 78 and chassis 62, 64, 66, 68 described with respect to the remote bank 50 is similarly utilized by modules 12, 14, 16, 18, 20 on the main rack of the industrial controller 10, where each module 12, 14, 16, 18, 20 includes abase 22, 24, 26, 28, 30 and a chassis 32, 34, 36, 38, 40, respectively.

Figure 5:
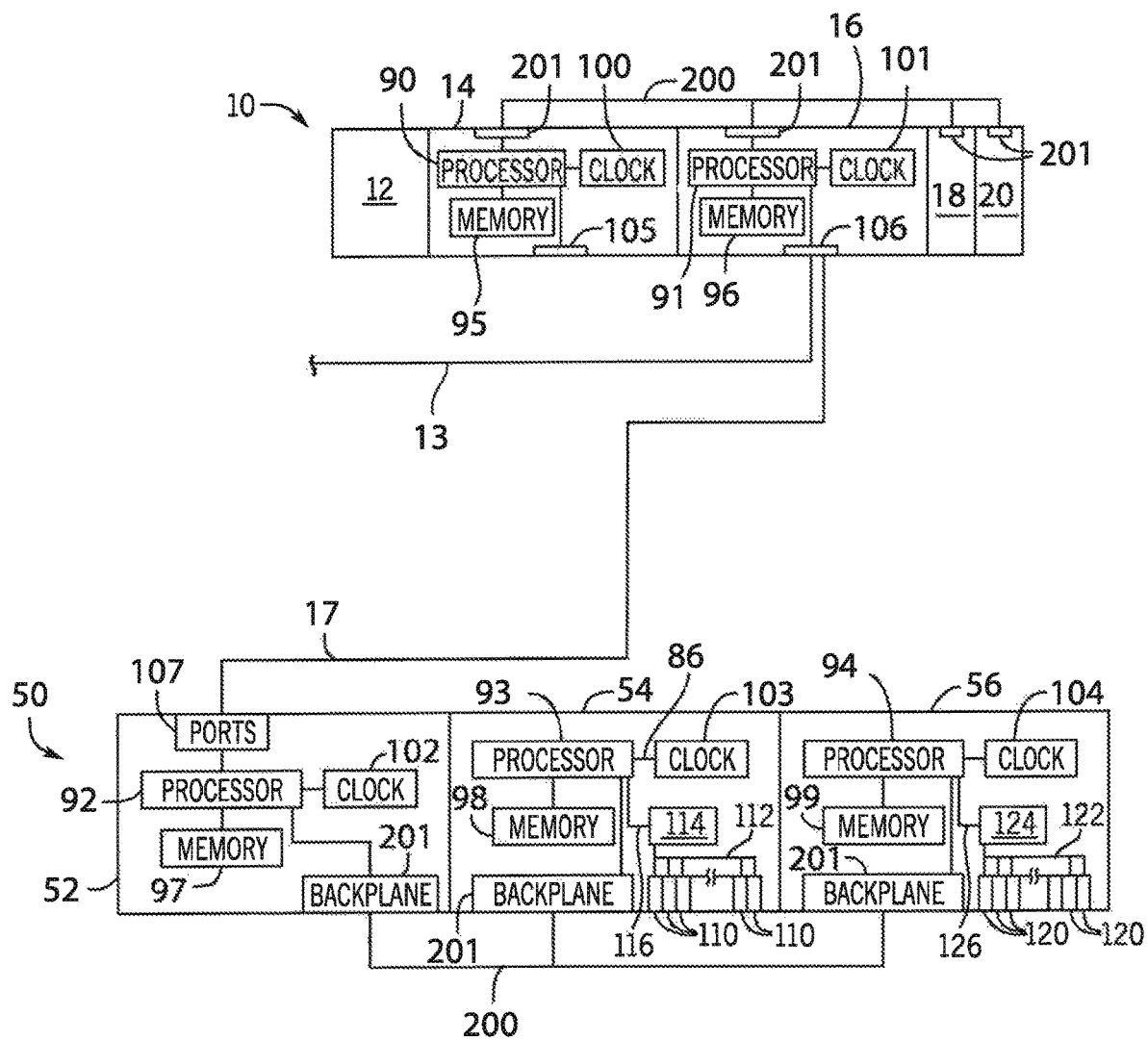
FIG. 5 is a partial block diagram representation of the industrial control system of FIG. 1.

Referring next to FIG. 5, a portion of the exemplary industrial control system of FIG. 1 is illustrated in block diagram form. Due to factors such as the increasingly distributed nature of the control network and the increasing capability and reduced cost of processing devices, it is contemplated that each of the modules in the system may include a processor 90-94 and a memory device 95-99. The processors 90-94 are configured to execute instructions and to access or store operating data and/or configuration parameters stored in the corresponding memory device 95-99. The processors 90-94 may be any suitable processor according to the module requirements. It is contemplated that processors 90-94 may include a single processing device or multiple processing devices executing in parallel and may be implemented in separate electronic devices or incorporated on a single electronic device, such as a field programmable gate array (FPGA) or application specific integrated circuit (ASIC). Similarly, the memory devices 95-99 may be a single device, multiple devices or may be incorporated in part or in whole within the FPGA or ASIC. Each of the modules also includes a clock circuit 100-104, and each clock circuit 100-104 may be synchronized with the other clock circuits 100-104 according to, for example, the IEEE-1588 clock synchronization standard. Each clock circuit 100-104 generates a time signal configurable to report the present time accurate to either microseconds or nanoseconds. Communication between modules mounted in the same rack or contained within a single housing occurs via a backplane 200 and a corresponding backplane connector 201. Modules communicating via network media 17 include ports 105-107 configured to process the corresponding network protocol. Each input module 54 includes input terminals 110 configured to receive the input signals 19 from the controlled machine or process 15. The input module 54 also includes any associated logic circuitry 114 and internal connections 112, 116 required to process and transfer the input signals 19 from the input terminals 110 to the processor 93. Similarly, each output module 56 includes output terminals 120 configured to transmit the output signals 21 to devices in the controlled machine or process 15. The output module 56 also includes any associated logic circuitry 124 and internal connections 122, 126 required to process and transfer the output signals 21 from the processor 94 to the output terminals 120.

Figure 6:
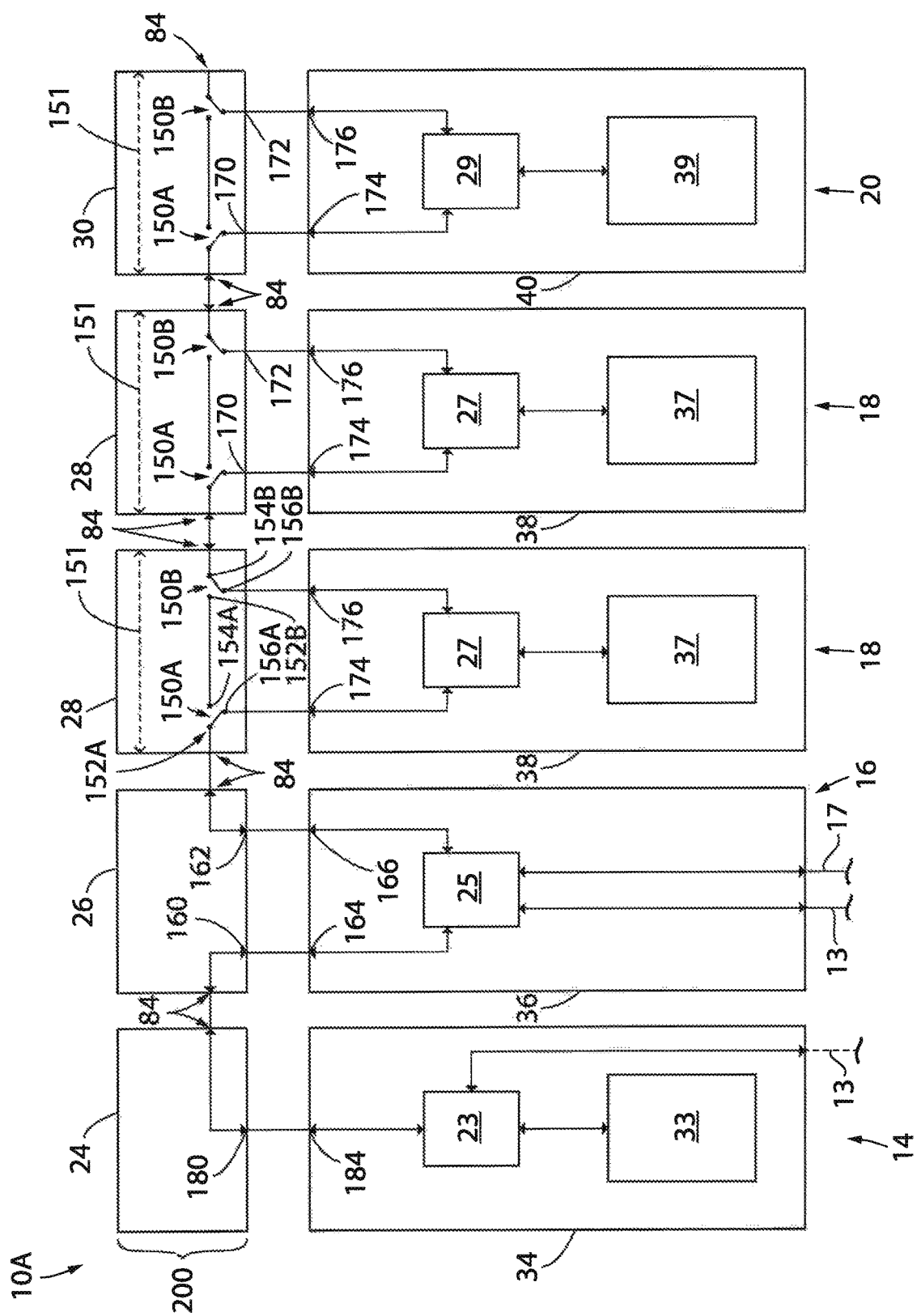
FIG. 6 is a block diagram representation of an industrial controller incorporating one embodiment of the present invention.

In operation, the industrial controller 10 provides a modular backplane 200 between the various modules defining the industrial controller. Turning next to FIG. 6, an exemplary embodiment of an industrial controller 10A is illustrated. The illustrated embodiment includes a processor module 14, a network module 16, two input modules 18, and an output module 20. It is contemplated that the industrial controller 10 communicates with other devices, such as another industrial controller, an operator interface, a programming terminal, and the like via a network 13, 17. The network may include standard network devices and protocols, such as Ethernet, TCP/IP, and the like, industrial network devices and protocols, such as Ethernet/IP, DeviceNet, ControlNet, or the like, or a combination thereof.

Figure 11:
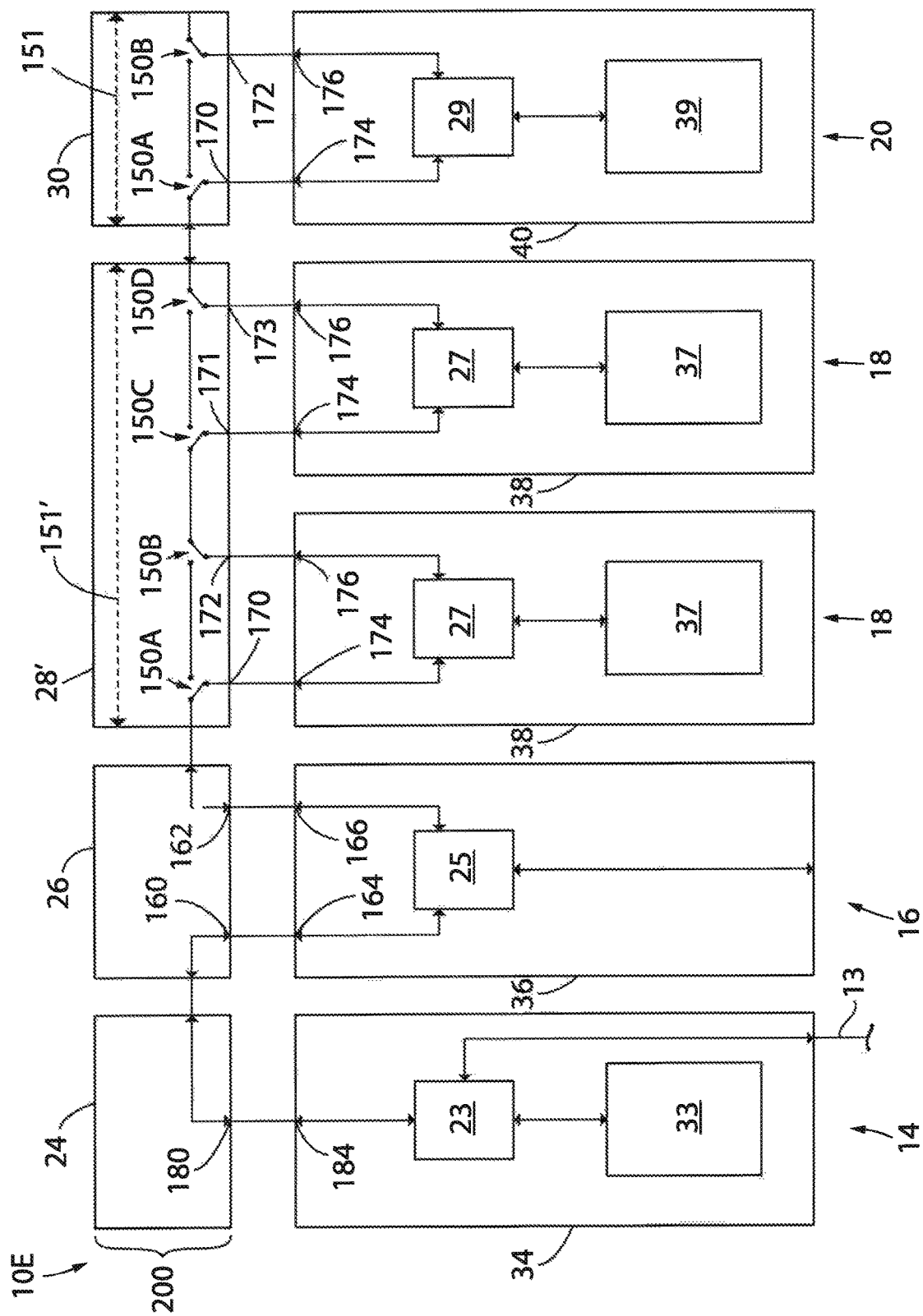
FIG. 11 is a block diagram representation of an industrial controller incorporating another embodiment of the present invention.

A device connected via the network communicates in a point-to-point configuration, generating data packets for and transmitting those data packets to other devices with which the first device wishes to communicate. The data packets transmitted via the point-to-point configuration are referenced herein as being in a first protocol, requiring, for example, a source address, a destination address, connection information, and the like. According to the illustrated embodiment, the network 13 is connected to the network module 16. In certain embodiments, the network module 16 may include multiple networks 13, 17 such as those illustrated in FIG. 1. It is further contemplated that the network 13 may be connected to the processor module 14, as shown in FIG. 11. It is contemplated that in alternate embodiments a portion of, or the entire functionality of, the network module 16 may be incorporated within the processor module 14 without deviating from the scope of the invention.

Data communicated in a point-to-point configuration between devices remotely connected via the first protocol may be more efficiently communicated between modules connected to each other using a backplane 200 via a second protocol. The second protocol may utilize, for example, a proprietary data structure, where data for each module 14, 16, 18, 20 in the industrial controller 10A is inserted in a predefined order, format, or combination thereof and transmitted with minimal or no header information. Each module 14, 16, 18, 20 in the industrial controller 10A is configured to insert and/or extract data according to the proprietary data structure, maximizing the bandwidth of data to be transmitted via the backplane 200. Various other protocols for communication via the backplane may be utilized without deviating from the scope of the invention.

According to one embodiment of the invention, the data received from the network 13 in the first protocol is converted to the second protocol prior to transmission on the backplane 200. The embedded switch 25 within the network module 16 may be configured to convert the data from one protocol to another protocol prior to transmitting the data. Optionally, a local logic circuit may be provided within the network module 16, where the local logic circuit is configured to convert the data between protocols. In alternate embodiments, the network module 16 may be a dedicated conversion module where the network data packets are received from the network 13, for example, by the processor module 14 and transmitted via a first portion of the backplane 200 from the processor module base to the network module base 26 and to the embedded switch 25 in the conversion module 16. The embedded switch 25 may then convert the data from the first protocol to the second protocol. According to still another embodiment of the invention, the processor module 14 may be configured to receive the data from the network 13 in the first protocol and convert the data to the second protocol for transmission via the backplane 200.

According to another embodiment of the invention, the data received from the network 13 in the first protocol may be passed directly along the backplane 200 in the first protocol. The embedded switch 25 within the network module 16 may be configured to receive the data packet from the network 13, identify a module along the backplane 200 for which the packet is intended, and retransmit the data packet along the backplane 200 to the intended recipient.

According to yet another embodiment of the invention, the data received at the network module may be from another backplane 200 and formatted in the second protocol. The network module 16 may be connected via a network 17 to a remote rack or to another industrial controller configured to control another portion of the controlled machine or process. Rather than converting data between protocols for transmission, a first network module 16 on the remote rack or in the remote industrial controller may transmit data directly via the second protocol to a second network module 16. The embedded switch 25 in the second network module 16 identifies the data packet as being formatted in the second protocol and passes the data packet directly along the backplane 200 where one or more modules may interact with the data packet according to the configuration of and/or the data present within the received data packet.

With reference again to FIG. 6, the processor module 14 includes a base 24 and a chassis 34 removably mounted to the base 24. The base 24 includes a port 180 in communication with a complementary port 184 in the chassis 34. The ports 180, 184 are connected by terminals in the electrical connector 71 on the mating surface of the base 24 and complementary terminals in an electrical connector on the mating surface of the chassis 34. The chassis 34 of the processor module 14 also includes a local control circuit 33 which performs the functions of the module and includes, for example, the processor 90, memory 95, and clock circuit 100 for the processor module 14.

An embedded switch 23 within the chassis 34 of the processor module 14 receives data packets from the base 24 and/or data packets from a network 13 (e.g., when the network 13 is connected to the processor module 14) and routes the packets to the appropriate destination. If the network 13 is connected to the processor module 14, data packets in the first protocol are being received at the processor module. In some embodiments, a network module 16 may transmit data packets received from the network 13 to the processor module 14 in the first protocol. Other data packets may be received at the embedded switch 23 from the backplane 200 in the second protocol. The embedded switch 23 is operative to determine whether a data packet is in the first or second protocol, extract data from the data packet, convert data received in either the first or second protocol to the other protocol if necessary, and transmit the data to the appropriate destination.

For example, the embedded switch 23 in the processor module 14 may receive a first data packet from the network 13 where the first data packet includes data for the local control circuit 33 within the processor module 14. The embedded switch 23 is operative to extract the data and transmit the data to the local control circuit 33. The embedded switch 23 may also receive a second data packet from the network 13 where the second data packet includes data to be output as control signals on the output module 20. The embedded switch 23 converts the data from the first protocol to the second protocol and transmits the data via the backplane 200 to the output module 20. Still other data packets may be received from the backplane 200, for example, from the input modules 18 which include data corresponding to the operating status of the controlled machine or process 15. The embedded switch 23 may pass the data through to the local control circuit 33 for use in a control program executing on the processor module 14. Still other data from the input modules 18 may need to be transmitted to a remote station, such as an operator interface or a data logging terminal. The embedded switch 23 may convert the data from the second protocol to the first protocol and transmit the data via the network 13 to the appropriate location.

The network module 16 also includes a base 26 and a chassis 36 removably mounted to the base 26. The base 26 includes a first port 160 and a second port 162 in communication with complementary ports 164 and 166, respectively, in the chassis 36. The ports 160-166 are defined by terminals in the electrical connector(s) 71 on the mating surface of the base 26 and complementary terminals in an electrical connector on the mating surface of the chassis 36. An embedded switch 25 within the chassis 36 of the network module 16 receives data packets from the base 26 and/or data packets from a network 13 if the network 13 is connected to the network module 16. Although not illustrated in FIG. 6, the network module 16 may also include a local control circuit which includes, for example, the processor 91, memory 96, and clock circuit 101 for the network module 16.

Additional modules, such as the input modules 18 and the output module 20, also include a base 28, 30 and a chassis 38, 40 removably mounted to the respective base. The bases 28, 30 each include a first port 170 and a second port 172 in communication with a complementary port 174 and 176, respectively, in the chassis 38, 40. The ports 170-176 are defined by terminals in the electrical connector(s) 71 on the mating surface of the base 28, 30 and complementary terminals in an electrical connector on the mating surface of the chassis 38, 40. Embedded switches 27, 29 within the chassis 38, 40 of the input modules 18 and the output module 20 receive data packets from the respective base 28, 30. Each input and output module 18, 20 includes a local control circuit 37, 39 which includes, for example, the processor, memory, clock circuit, input circuits, and output circuits for the respective modules.

Figure 9:
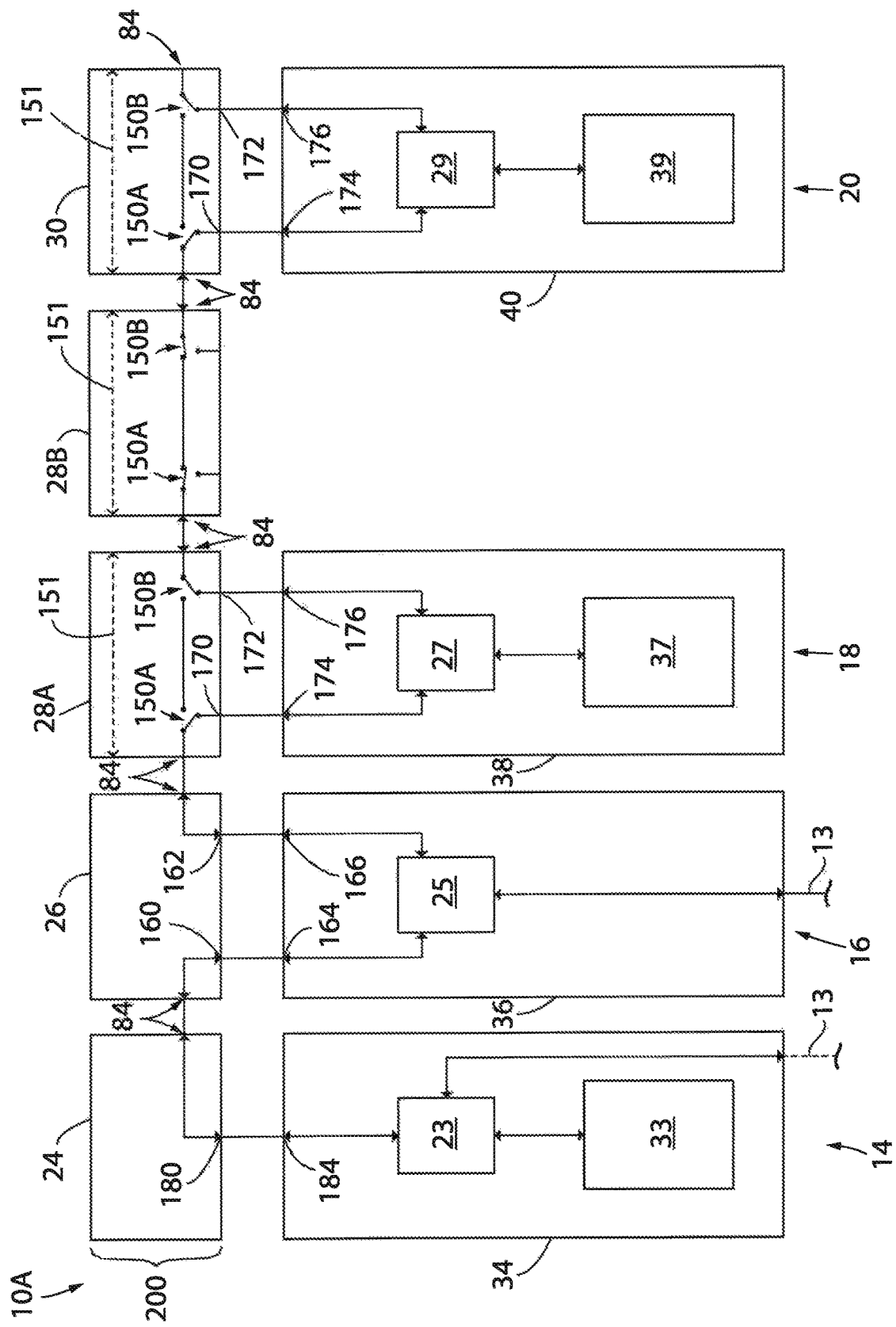
FIG. 9 is a block diagram representation of the industrial controller of FIG. 6 with a module missing.

Each base 24-30 in the illustrated embodiment of FIG. 6 may be mounted to a DIN rail 51 and electrically connected to one (if positioned on an end) or both (if positioned between the end modules) of the bases adjacent to the module via electrical connectors 84 on the base. The bases 24-30 of each module define a backplane 200 between modules in the industrial controller 10A. With reference also to FIG. 9, each base may also include one or more switches 150 which allows a chassis on the modules to be inserted or removed and still maintain communication between modules. For ease of illustration, each switch 150 is shown as a single pole double throw switch which is electrically connected to one of the electrical connectors 84 on the base and alternately connected to the chassis, if mounted, or to the other electrical connector, if the chassis is not mounted.

With reference to an input module 18, shown in FIG. 9, each switch 150A, 150B is in a first position when the chassis 38 is not mounted to the base 28B. A first switch 150A, in communication with a first electrical connector 84 on a first side of the base 28B, establishes a normally closed connection to a first throw of the first switch 150A. The first throw of the of the first switch 150A is electrically connected to a first throw of a second switch 150B within the base 28B. The second switch 150B, in communication with a second electrical connector 84 on a second side of the base 28B, similarly establishes a normally closed connection to the first throw of the second switch 150B. As a result, when no chassis 38 is connected to the base 28B, an electrical connection on the backplane 200 is established through the base 28B between the first and second electrical connectors 84 via the first and second switches 150A, 150B and via an internal connection between the first and second switches 150A, 150B.

When the chassis 38 of the input module 18 is mounted to the base 28, the chassis 38 causes the state of the switch 150 to change. In one embodiment, a mechanical coupling occurs, for example, via one of the mating receptacles 89 in the base 28 and a complementary member extending from the mating surface of the chassis 38 into the mating receptacle. The mechanical coupling causes the connection in each switch 150A, 150B between the first pole and the first throw to open and establishes a second electrical connection between the first pole and a second throw. The second throw for each switch 150A, 150B is connected to one of the ports 170, 172 communicating with the chassis 38. Thus, when the chassis 38 is mechanically mounted to the base 28A, the backplane 200 is routed through the embedded switch 27 within the chassis 38. The electrical connection along the backplane is established from the first electrical connector 84 through the first switch 150A to the first port 170 of the base 28, through the complementary port 174 of the chassis, and to the embedded switch 27 within the chassis 38. The electrical connection continues from the embedded switch 27 within the chassis 38, through the second port 176 of the chassis 38, to the complementary second port 172 in the base 28A, through the second switch 150B, and to the second electrical connector 84. The insertion/removal of the chassis 38 to the base 28 activates the switch 150 providing for continuous connection of the backplane through the base 28 regardless of whether the chassis 38 is mounted to the base 28.

According to another embodiment, the switch 150 may be a solid-state switch defined, for example, by one or more transistors. Connection of the chassis 38 to the base 28 creates an electrical path that causes the switch to change state. Thus, just as with a mechanical switch, when the chassis 38 is mounted to the base 28, each switch 150 routes the backplane 200 through the embedded switch 27 within the chassis 38. When the chassis 38 is not mounted to the base 28, the switch 150 routes the backplane 200 through the base 28, providing a continuous communication path between adjacent bases 28 regardless of whether the chassis 38 is mounted to the base 28.

Thus, if a chassis 38 for a module fails, needs to be replaced, or is being upgraded, the processor module 14, and the control program executing within the processor module, may be configured to continue operation of at least a portion of the controlled machine or process 15 with the remaining modules for the industrial controller 10A, providing the devices connected to the chassis 38 being replaced are not required for continued operation of that portion of the controlled machine or process 15.

Figure 12:
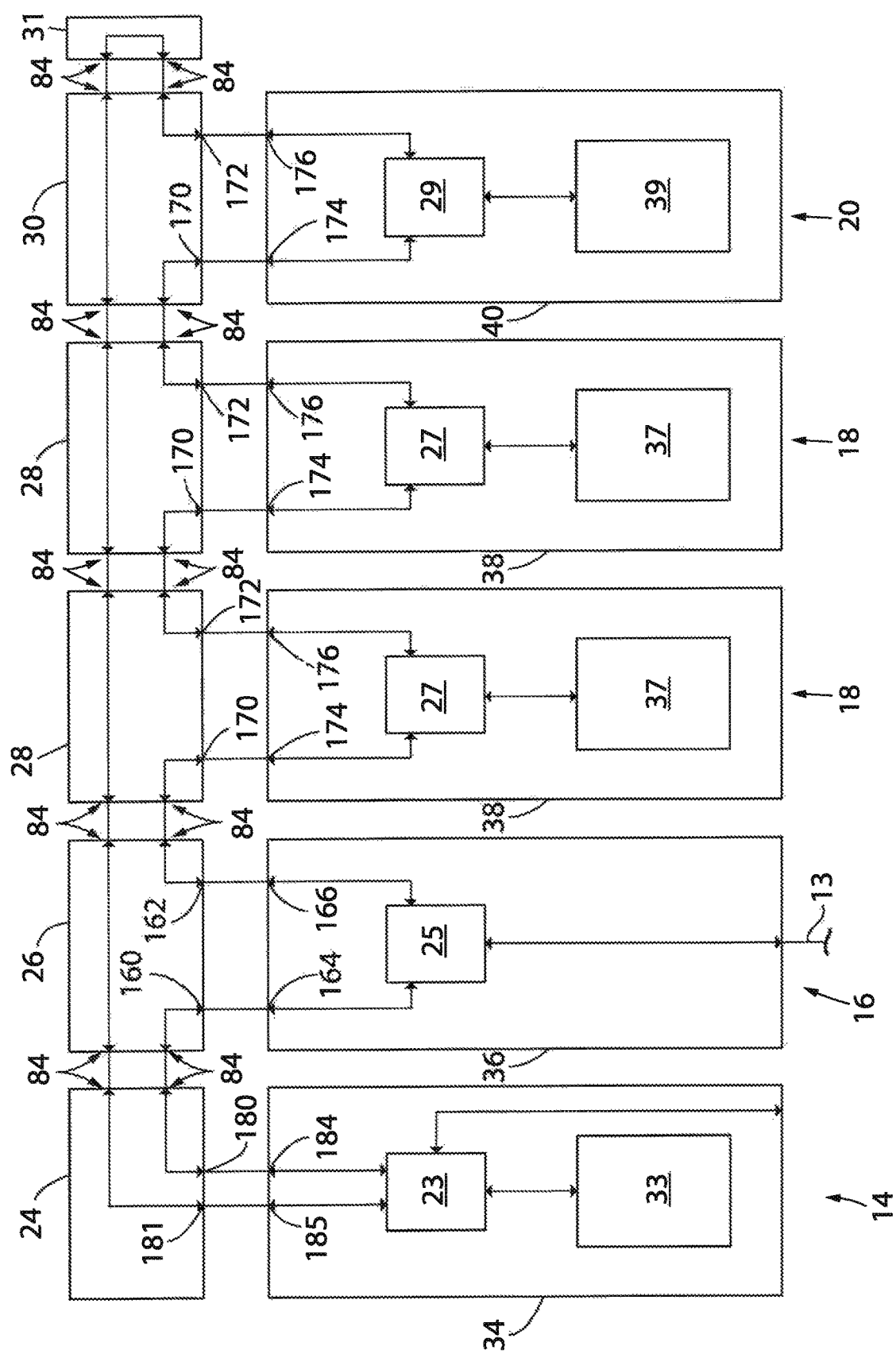
FIG. 12 is a block diagram representation of an industrial controller incorporating another embodiment of the present invention.

With reference to FIG. 12, it is contemplated that each base may be configured without a switch 150 and may provide a single path through the embedded switch for the respective module connected to the base. In such a configuration, it is further contemplated that an endcap 31 may be provided to provide the ability to replace a chassis 38 for at least a single module at a time while the processor module continues operation of at least a portion of the controller machine or process 15. The end cap 31 establishes a ring configuration on the backplane 200 providing for communication in either direction around the backplane 200. When a single chassis 38 is removed from its base 28, each remaining chassis is still able to communicate to the other chassis in one direction or another. Thus, the chassis 38 for at least one module may be replaced or upgraded at a time if the control program is configured to continue operation of the remaining portions of the controlled machine or process 15.

According to the embodiment of the industrial controller 10A shown in FIGS. 6 and 9, the processor module 14 and/or the network module 16 may receive data in a first protocol from the network 13 in a single-path star configuration and the modules may communicate to each other along the backplane 200 in a second protocol via a one-half ring configuration. The data transmitted in the single-path star configuration is point-to-point data transmitted via the network. The network is a single-path star configuration because a single network 13 is provided and a single communication path exists between the industrial controller 10A and other devices remotely connected via the network 13. The single-path star configuration is in contrast to the redundant star configuration which will be discussed in more detail below. The data transmitted between modules is transmitted in a one-half ring configuration, or in a linear topology, between modules because there is a single communication pathway between modules. The transmission pathway is bidirectional/full-duplex, allowing data to be transmitted from the output module 20 to the processor module 14 or from the processor module 14 to the output module 20. Similarly, data may be transmitted to or from any intermediate module (e.g., the network module 16 and the input module 18) and one of the end modules (e.g., the processor module 14 and the output module 20) in either direction. However, any particular data transfer between modules has a single bidirectional/full-duplex communication path along the backplane 200 between the modules.

As also illustrated in FIGS. 6 and 9, each base 28, 30 of the additional modules may further include an optional communication path 151 extending between the first and second electrical connectors on each side of the base. The optional communication path 151 may be utilized to convert the one-half ring communication in the additional modules to a full ring communication among the additional modules.

Figure 7:
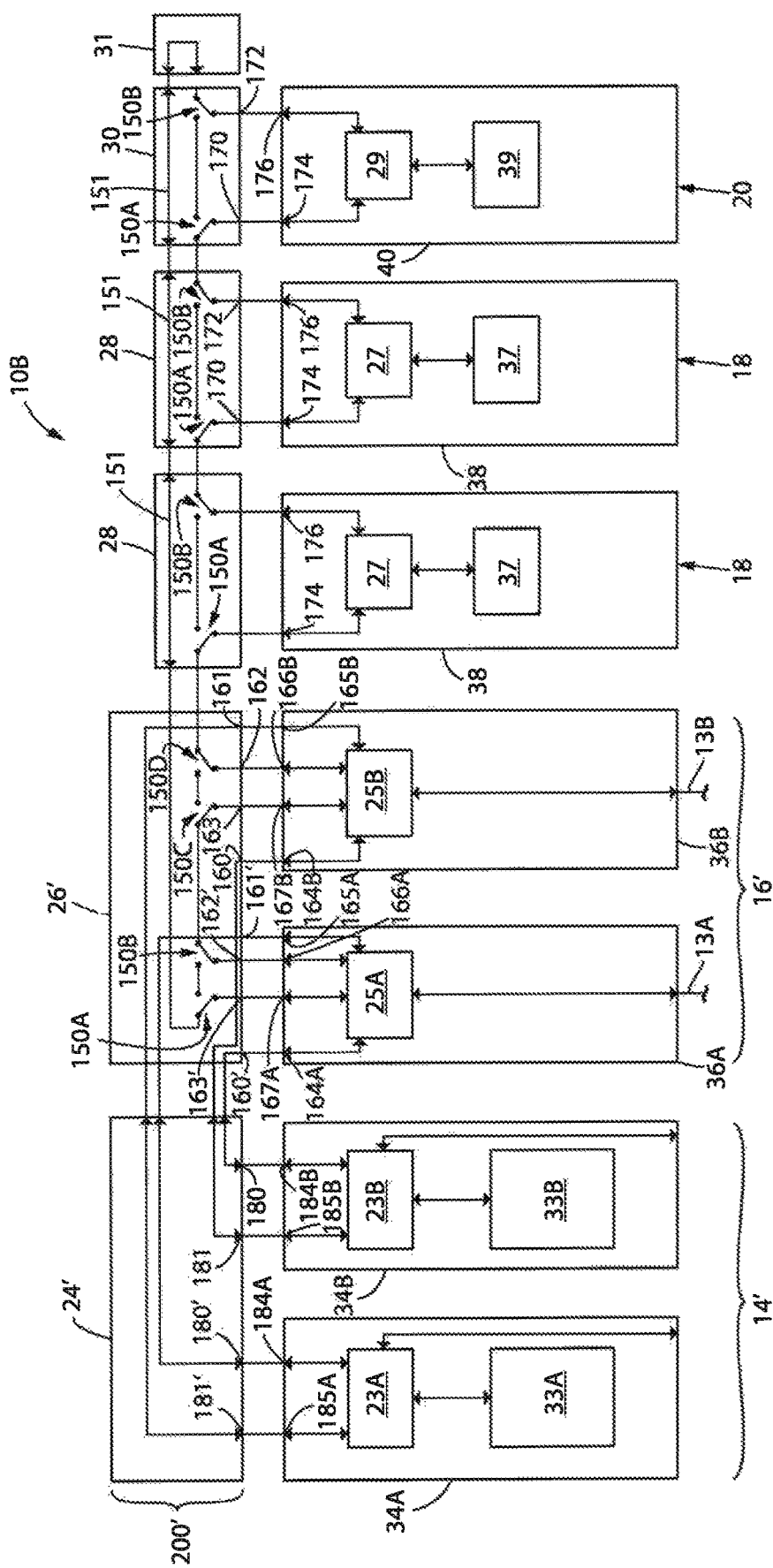
FIG. 7 is a block diagram representation of an industrial controller incorporating another embodiment of the present invention.

With reference now to FIG. 7, a second embodiment of the industrial controller 10B is illustrated. The second embodiment of the industrial controller 10B is configured to receive data in a first protocol from a network 13 in a redundant star configuration and the modules are configured to communicate between each other along the backplane 200 in a second protocol utilizing a full ring configuration. An end cap 31 connected to a second electrical connection of the base 30 for the output module 20 establishes an electrical connection from the linear communication path of the one-half ring configuration, discussed above, to the optional communication path 151 within each of the additional modules. This end cap defines a first end of the full ring, where the second end is defined within the base 26' of the network module 16', as will be discussed in more detail below.

The redundant star configuration of the industrial controller 10B utilizes a second embodiment of the base 24', 26' for the processor module 14' and network module 16' respectively. Each redundant base 24', 26' includes connections for two chassis to be mounted to the base. The redundant processor module base 24' includes a first processor module chassis 34A and a second processor module chassis 34B, where each processor module chassis 34A, 34B may be identical in configuration to the processor module chassis 34 discussed above. Although the redundant processor module 14' is illustrated with two ports between the embedded switch 23A, 23B in each chassis 34A, 34B and the redundant base 24', the processor module chassis 34 discussed above with respect to FIG. 6, may similarly include two ports, where one of the ports is unused in the single-path configuration. The redundant network module base 26' includes a first network module chassis 36A and a second network module chassis 36B, where each network module chassis 36A, 36B may be identical in configuration to the network module chassis 36 discussed above. Although the redundant network module 16' is illustrated with four ports between the embedded switch 25A, 25B in each chassis 36A, 36B and the redundant base 26', the network module chassis 36 discussed above with respect to FIG. 6, may similarly include four ports, where two of the ports are unused in the single-path configuration.

The processor module 14' and/or the network module 16' receives data in a first protocol from a redundant network in the redundant-star configuration. The redundant processor module 14' includes a base 24' configured to receive two chassis 34A, 34B, each removably mounted to the base 24'. The base 24' includes four ports 180, 180', 181 and 181' (referred to herein as 180-181'), where two ports are in communication with complementary ports in each chassis 34A, 34B. The first port 180 in the base 24' is connected to a first port 184B in the second chassis 34B, the second port 181 in the base 24' is connected to a second port 185B in the second chassis 34B, the third port 180' in the base 24' is connected to a first port 184A in the first chassis 34A, the fourth port 181' in the base 24' is connected to a second port 185A in the first chassis 34A. The ports 180-181' are defined by terminals in the electrical connector(s) 71 on the mating surface of the base 24' and complementary terminals in an electrical connector on the mating surfaces of each chassis 34A, 34B. Each chassis 34A, 34B of the processor module 14' also includes a local control circuit 33A, 33B which performs the functions of the module and includes, for example, the processor, memory, and clock circuit for the corresponding chassis of the processor module 14'.

The redundant network module 16' also includes a base 26' configured to receive two chassis 36A, 36B, each removably mounted to the base 26'. The base 26' includes eight ports 160-163', where four ports are in communication with complementary ports in each chassis 36A, 36B. The first port 160 in the base 26' is connected to a first port 164B in the second chassis 36B, the second port 161 in the base 26' is connected to a second port 165B in the second chassis 36B, the third port 162 in the base 26' is connected to a third port 166B in the second chassis 36B, the fourth port 163 in the base 26' is connected to a fourth port 167B in the second chassis 36B, the fifth port 160' in the base 26' is connected to a first port 164A in the first chassis 36A, the sixth port 161' in the base 26' is connected to a second port 165A in the first chassis 36A, the seventh port 162' in the base 26' is connected to a third port 166A in the first chassis 36A, and the eighth port 163' in the base 26' is connected to a fourth port 167A in the first chassis 36A. The ports 160-163' are defined by terminals in the electrical connector(s) 71 on the mating surface of the base 26' and complementary terminals in an electrical connector on the mating surfaces of each chassis 36A, 36B.

For convenience, the redundant network will be described with connection to the network module 16' receiving the data from the network as shown, but it is understood that a redundant network may similarly be connected to the processor module 14' in a manner similar to the single-path network discussed above. The redundant network includes a first network 13A connected to the first chassis 36A and a second network 13B connected to the second chassis 36B. Identical data may be transmitted in tandem in redundant data packets on each network 13A, 13B from a remote device to the redundant network module 16'. The first embedded switch 25A in the first chassis 36A for the redundant network module 16' receives the data packets from the first network 13A, and the second embedded switch 25B in the second chassis 36B for the redundant network module 16' receives the data packets from the second network 13B. The redundant network module 16' is further configured to compare the redundant data received from each network 13A, 13B to each other to verify correct transmission of data. It is contemplated that one embedded switch 25A may be configured to perform the comparison and receive the data from the other embedded switch 25B via the base 26'. Optionally, a local logic circuit in one of the two chassis 36A, 36B may be configured to perform the comparison. According to still another embodiment of the invention, full redundancy may provide for both embedded switches and/or both local logic circuits comparing the data received at one chassis with the data received at the other chassis. When the redundant network module 16' verifies that the data has been properly received from the redundant networks 13A, 13B in the first protocol. Each chassis converts the data to the second protocol for transmission to the appropriate module via the redundant backplane 200'.

As previously indicated, the network module base 26' for the redundant network includes a second end of the device level ring for the backplane. In addition to the end cap 31 connected to the opposite end of the ring, a full ring topology is established between the network module 16' and each of the additional modules 18, 20. Data may be transmitted around the ring in either direction to each of the modules. As a result, even in the event of a single failure of the hardware along the ring, each module will still have a communication path to the other modules. Each embedded switch 25A, 25B may transmit data received along the ring topology to one of the additional modules 18, 20. The embedded network switch 27, 29 in the respective additional module receives the redundant data packets in the second protocol and verifies correct reception of data within the additional module. Similarly, data from each additional module may be transmitted back to each of the embedded switches 25A, 25B. Each embedded switch 25A, 25B may pass the data to the processor module 14' which determines which data is required for use within the processor module 14' and which data should be transmitted externally via the networks 13A, 13B. The processor module 14' may generate a data packet for transmission via the networks 13A, 13B and pass the data packet back to the network module 16' to send out via the networks 13A, 13B. Optionally, the embedded switches 25A, 25B or an additional local logic circuit (not shown) within the network module 16' may be configured to identify at least a portion of data from the additional modules that is to be transmitted via the networks 13A, 13B and converts the data to a separate data message in the first protocol for retransmission via the redundant networks 13A, 13B.

Previously, FIGS. 6 and 9 have been discussed with respect to a single-path star network and one-half ring configuration. Each of these configurations provides for a single channel of communication whether in the point-to-point first protocol or in the linear backplane second protocol. FIG. 7 illustrates a redundant star network and a full ring configuration. Each of these configurations provides for redundant channels of communication whether in the first protocol for point-to-point communication or in the second protocol for backplane communication. However, the proposed modular system also allows for interconnection of modules with different numbers of communication channels.

Figure 8:
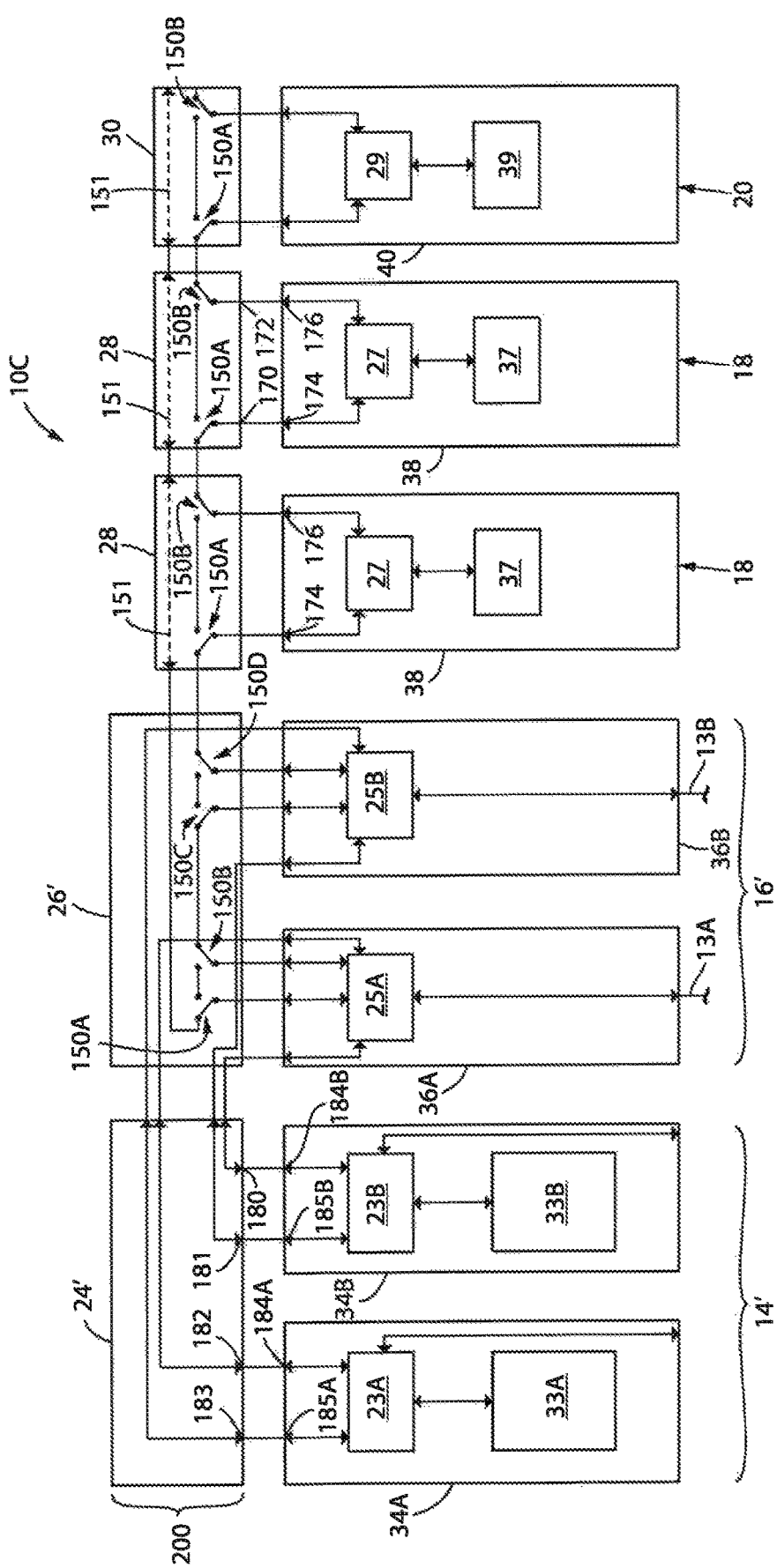
FIG. 8 is a block diagram representation of an industrial controller incorporating another embodiment of the present invention.

Turning next to FIG. 8, a third embodiment of the industrial controller 10C is illustrated. The third embodiment of the industrial controller 10C is configured to receive data in a first protocol from a network 13A or 13B in the redundant star configuration while the modules are configured to communicate between each other along the backplane 200 in the one-half ring configuration. The end cap 31 shown in FIG. 7 is removed. The rest of the components discussed above with respect to FIG. 7 are utilized. A redundant processor module 14' and a redundant network module 16' are combined with a pair of input modules 18 and an output module 20. Although the optional communication path 151 is connected at the left side of each module to the adjacent module and is further connected at the first input module 18 to one end of a device level ring within the base 26' of the redundant network module 16', because the end cap 31 is removed, the ring is incomplete and no communications occur along the optional communication path 151.

With comparison also to FIG. 6, it is observed that the additional modules (e.g., the input modules 18 and the output module 20) in FIG. 8 are identical to those disclosed in FIG. 6. Thus, the same additional modules could be utilized in a single-path and one-half ring system as those used in a partially redundant system. Similarly, the processor module 14' and the network module 16' illustrated in the partially redundant system are identical to those illustrated in the fully redundant system. The modularity of the modules allows for a reduced number of modules to be manufactured for different system configurations. Further, should an upgrade from a single-path and one-half ring system, as shown in FIG. 6, to the partially redundant system of FIG. 8 be desired, only a portion of the modules need to be changed, reducing the overall cost of upgrading the industrial controller 10.

Figure 10:
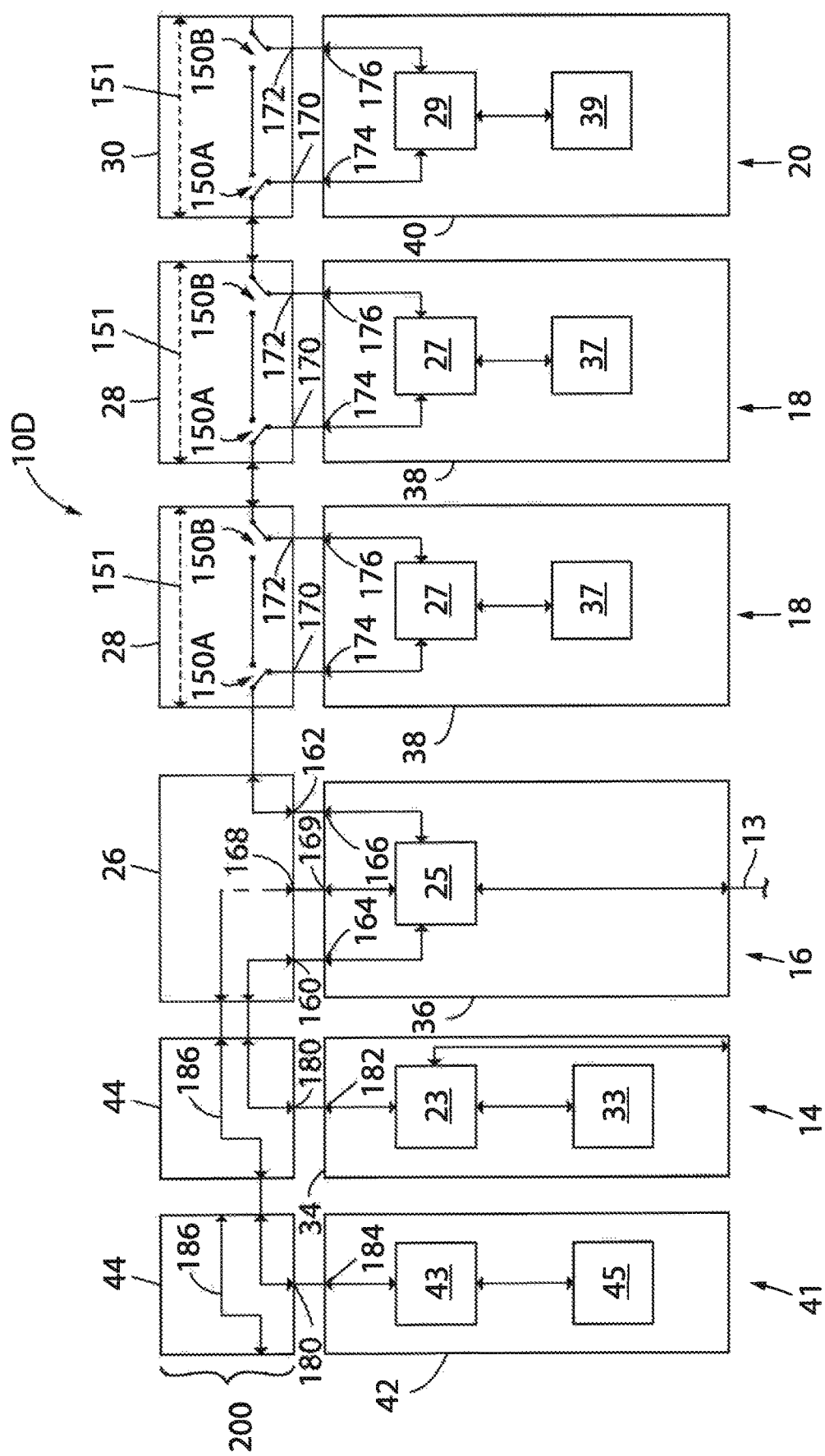
FIG. 10 is a block diagram representation of an industrial controller incorporating another embodiment of the present invention.

Turning next to FIG. 10, still another embodiment of the industrial controller 10D is illustrated. The industrial controller 10D of FIG. 10 includes an additional data appliance module 41 connected to the system. The additional data appliance 41 includes a base 44 and a chassis 42 removably mounted to the base 44. Similar to the base 24 for the processor module 14, disclosed in FIG. 6, the base 44 for the additional data appliance includes a port 180 in communication with a complementary port 184 in the chassis 42. The ports 180, 184 are connected by terminals in the electrical connector 71 on the mating surface of the base 44 and complementary terminals in an electrical connector on the mating surface of the chassis 42. Additionally, the base 24 includes a secondary communication path 186 between the first electrical connector and the second electrical connector on opposite sides of the base 44. The secondary communication path 186 carries data communications on the backplane 200 from the network module 16 to the additional data appliance 41. It is contemplated that the additional data appliance 41 may be configured for point-to-point communications and be configured to communicate via a suitable point-to-point communication protocol with the network module 16. An identical base 44 may be utilized by the processor module 14 since it contains an identical connection between the network module 16 and the embedded switch 23 within the processor module 14. Optionally, a single base 44 for the processor module 14 may be utilized in either application, where the base 44 includes the secondary communication path 186 but it is not utilized when an additional data appliance module 41 is not connected to the processor module 14.

The chassis 42 of the additional data appliance module 41 includes an embedded switch 43 and a local control circuit 45 which performs the functions of the module. The local control circuit 45 may include, for example, a processor, memory, and a clock circuit for the data appliance module 41. The data appliance may be configured to execute a computationally intensive process, such as motion profile generation, harmonic analysis, and the like, which may be desirable to offload from the processor module 14. Alternately, the data appliance may be a third-party module with specific functionality not otherwise available or alternately available to functionality provided by the processor module 14.

With reference next to FIG. 11, yet another embodiment of the industrial controller 10E is illustrated. The embodiment illustrated in FIG. 11 is again a single-path star and one-half ring system similar to that discussed above with respect to FIG. 6. However, it is contemplated that a base 28' may be provided for the additional modules that provides for multiple chassis to be plugged into the base 28'. According to the illustrated embodiment, two input module chassis 38 are plugged into a single input module base 28'. The two-slot base 28' includes separate pairs of switches (e.g., 150A, 150B and 150C, 150D) for each chassis 38 allowing the base to be utilized with no chassis 38, a single chassis 38, or with two chassis 38 plugged in to the base.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

I claim:

1. An industrial controller with a modular backplane, wherein the industrial controller is configured to control operation of a machine or process, the industrial controller comprising:
a processor module configured to execute a control program which controls operation of the machine or process, the processor module including:
a first base including a connector, and
a first chassis removably mounted to the first base, the first chassis including a first embedded switch; and
a plurality of additional modules, each of the plurality of additional modules including:
a second base, the second base including at least one connector configured to be connected to either the connector of the first base or to the at least one connector of another additional module, and
a second chassis removably mounted to the second base, the second chassis including a second embedded switch, wherein:
a backplane defines a communication path between the first base and the second base of each of the plurality of additional modules, and
the first embedded switch is operative to:
receive first data in a first communication protocol from an external network operatively connected to the first chassis,
receive second data in a second communication protocol from the first base, wherein the second data is communicated via the backplane,
convert the first data to the second communication protocol,
convert the second data to the first communication protocol,
transmit the first data in the second communication protocol to the backplane via the first base, and
transmit the second data in the first communication protocol to the external network.

2. The industrial controller of claim 1, wherein:
the at least one connector on the second base of each of the plurality of additional modules includes a first connector and a second connector;
a first communication path and a second communication path are defined through the second base of each of the plurality of additional modules between the first connector and the second connector; and
the backplane is defined within the second base of each of the plurality of additional modules by at least one of the first communication path and the second communication path.

3. The industrial controller of claim 2 further comprising an end cap removably connected to the second connector of the second base of one of the plurality of additional modules, wherein the end cap joins the first communication path and the second communication path through the end cap, defining one end of a ring network for the backplane.

4. The industrial controller of claim 1, wherein:
the processor module further includes a third chassis removably mounted to the first base;
the third chassis includes a third embedded switch in communication with the first base;
the external network is operatively connected to both the first chassis and the third chassis; and
the first embedded switch and the third embedded switch are configured to operate in tandem to:
receive the first data from the external network,
transmit the first data to the backplane via the first base,
receive the second data from the first base, and
transmit the second data to the external network.

5. The industrial controller of claim 1, wherein at least one of the plurality of additional modules includes a third chassis removably mounted to the second base, and wherein the third chassis includes a third embedded switch in communication with the corresponding second base.

6. The industrial controller of claim 1, wherein:
the at least one connector on the second base of each of the plurality of additional modules includes a first connector and a second connector;
at least one communication path is defined through the second base of each of the plurality of additional modules between the first connector and the second connector;
the second base of each of the plurality of additional modules further includes at least one switch, the at least one switch establishes a first communication path for the backplane between the first connector and the second connector of the second base when the second chassis is removed from the second base, and
the at least one switch establishes a second communication path for the backplane between the first connector and the second embedded switch and a third communication path for the backplane between the second connector and the second embedded switch when the second chassis is mounted to the second base.

7. An industrial controller with a modular backplane, wherein the industrial controller is configured to control operation of a machine or process, the industrial controller comprising:
a processor module configured to execute a control program which controls operation of the machine or process;
a network module operatively connected to the processor module, the network module including:
a first base including a connector, and
a first chassis removably mounted to the first base, the first chassis including a first embedded switch; and
a plurality of additional modules, each of the plurality of additional modules including:
a second base, the second base including at least one connector configured to be connected to either the connector of the first base or to the at least one connector of another additional module, and
a second chassis removably mounted to the second base, the second chassis including a second embedded switch, wherein:
a backplane defines a communication path between the first base and the second base of each of the plurality of additional modules, and
the first embedded switch is operative to:
receive first data in a first communication protocol from an external network operatively connected to the first chassis,
receive second data in a second communication protocol communicated via the backplane from the first base,
convert the first data to the second communication protocol and convert the second data to the first communication protocol,
transmit the first data in the second communication protocol to the backplane via the first base, and
transmit the second data in the first communication protocol to the external network.

8. The industrial controller of claim 7, wherein:
the at least one connector on the second base of each of the plurality of additional modules includes a first connector and a second connector;
a first communication path and a second communication path are defined through the second base of each of the plurality of additional modules between the first connector and the second connector; and
the backplane is defined within the second base of each of the plurality of additional modules by at least one of the first communication path and the second communication path.

9. The industrial controller of claim 8 further comprising an end cap removably connected to the second connector of the second base of one of the plurality of additional modules, wherein the end cap joins the first communication path and the second communication path through the end cap, defining one end of a ring network for the backplane.

10. The industrial controller of claim 7, wherein:
the network module further includes a third chassis removably mounted to the first base;
the third chassis includes a third embedded switch in communication with the first base;
the external network is operatively connected to both the first chassis and the third chassis; and
the first embedded switch and the third embedded switch are configured to operate in tandem to:
receive the first data from the external network,
transmit the first data to the backplane via the first base,
receive the second data from the first base, and
transmit the second data to the external network.

11. The industrial controller of claim 7, wherein at least one of the plurality of additional modules includes a third chassis removably mounted to the second base, and wherein the third chassis includes a third embedded switch in communication with the corresponding second base.

12. The industrial controller of claim 7, wherein:
the at least one connector on the second base of each of the plurality of additional modules includes a first connector and a second connector;
at least one communication path is defined through the second base of each of the plurality of additional modules between the first connector and the second connector;
the second base of each of the plurality of additional modules further includes at least one switch,
the at least one switch establishes a first communication path for the backplane between the first connector and the second connector of the second base when the second chassis is removed from the second base, and
the at least one switch establishes a second communication path for the backplane between the first connector and the second embedded switch and a third communication path for the backplane between the second connector and the second embedded switch when the second chassis is mounted to the second base.

13. An industrial control system configured to control operation of a machine or process, the industrial control system comprising:
an industrial network; and
an industrial controller, including:
a processor module configured to execute a control program which controls operation of the machine or process, the processor module including:
a first base including a connector, and
a first chassis removably mounted to the first base, the first chassis including a first embedded switch; and
a plurality of additional modules, each of the plurality of additional modules including:
a second base, the second base including at least one connector configured to be connected to either the connector of the first base or to the at least one connector of another additional module, and
a second chassis removably mounted to the second base, the second chassis including a second embedded switch, wherein:
a backplane defines a communication path between the first base and the second base of each of the plurality of additional modules, and
either the first or second embedded switch is operative to:
receive first data in a first communication protocol from the industrial network;
convert the first data to the second communication protocol;

transmit the first data in the second communication protocol to the backplane,
receive second data in a second communication protocol from the backplane,
convert the second data to the first communication protocol, and
transmit the second data in the first communication protocol to the industrial network.

14. The industrial control system of claim 13 wherein the first embedded switch is connected to the industrial network.

15. The industrial control system of claim 13 wherein:
one of the plurality of additional modules is a network module, and the second embedded switch in the network module is connected to the industrial network.

16. The industrial control system of claim 13, wherein:
the at least one connector on the second base of each of the plurality of additional modules includes a first connector and a second connector;
a first communication path and a second communication path are defined through the second base of each of the plurality of additional modules between the first connector and the second connector; and
the backplane is defined within the second base of each of the plurality of additional modules by at least one of the first communication path and the second communication path.

17. The industrial control system of claim 16 further comprising an end cap removably connected to the second connector of the second base of one of the plurality of additional modules, wherein the end cap joins the first communication path and the second communication path through the end cap, defining one end of a ring network for the backplane.

18. The industrial control system of claim 13, wherein:
the at least one connector on the second base of each of the plurality of additional modules includes a first connector and a second connector;
at least one communication path is defined through the second base of each of the plurality of additional modules between the first connector and the second connector;
the second base of each of the plurality of additional modules further includes at least one switch,
the at least one switch establishes a first communication path for the backplane between the first connector and the second connector of the second base when the second chassis is removed from the second base, and
the at least one switch establishes a second communication path for the backplane between the first connector and the second embedded switch and a third communication path for the backplane between the second connector and the second embedded switch when the second chassis is mounted to the second base.

* * * * *